(12) United States Patent
Hanaoka et al.

(10) Patent No.: US 9,078,356 B2
(45) Date of Patent: Jul. 7, 2015

(54) ELECTRICAL COMPONENT DEVICE

(71) Applicant: Yazaki Corporation, Tokyo (JP)

(72) Inventors: Kiyotaka Hanaoka, Kakegawa (JP);
Takanori Kanamori, Kakegawa (JP);
Takuomi Wada, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/314,449

(22) Filed: Jun. 25, 2014

(65) Prior Publication Data

US 2015/0004819 A1 Jan. 1, 2015

(30) Foreign Application Priority Data

Jun. 26, 2013 (JP) ................. 2013-134114

(51) Int. Cl.
*H01R 13/46* (2006.01)
*H05K 5/02* (2006.01)
*H01R 13/74* (2006.01)

(52) U.S. Cl.
CPC ............ *H05K 5/0247* (2013.01); *H01R 13/748* (2013.01)

(58) Field of Classification Search
CPC ...................................... H01R 13/46
USPC ........ 439/135, 136, 137, 488, 489, 345, 76.2, 439/949; 174/549
See application file for complete search history.

(56) References Cited

U.S. PATENT DOCUMENTS

| 6,102,732 | A  | * | 8/2000  | Seko et al. ............. 439/489 |
| 6,276,957 | B1 | * | 8/2001  | Seko et al. ............. 439/489 |
| 6,287,139 | B1 | * | 9/2001  | Seko et al. ............. 439/489 |
| 2004/0142594 | A1 | * | 7/2004  | Endo .................... 439/489 |
| 2008/0153341 | A1 | * | 6/2008  | Shigeta et al. ........... 439/352 |
| 2008/0200045 | A1 | * | 8/2008  | Akahori et al. .......... 439/76.2 |
| 2008/0242124 | A1 | * | 10/2008 | Otsuji et al. ............ 439/76.2 |
| 2009/0029594 | A1 | * | 1/2009  | Matsuoka .............. 439/626 |
| 2009/0209116 | A1 | * | 8/2009  | Lopez ................. 439/76.2 |
| 2010/0105223 | A1 | * | 4/2010  | Taguchi et al. ........... 439/76.2 |
| 2011/0008988 | A1 | * | 1/2011  | Urano et al. ............ 439/350 |
| 2011/0198121 | A1 | * | 8/2011  | Matsumoto et al. ......... 174/549 |

FOREIGN PATENT DOCUMENTS

JP 2011-187933 A 9/2011

* cited by examiner

*Primary Examiner* — Tulsidas C Patel
*Assistant Examiner* — Peter G Leigh
(74) *Attorney, Agent, or Firm* — Sughrue Mion, PLLC

(57) ABSTRACT

An electrical component device includes an internal conductor, a case and a fitting detection connector. The internal conductor is connected to an electrical component and includes a fastening part configured to be fastened with an external conductor. The case accommodates the electrical component and the internal conductor and has a wall surface formed with a fastening opening for fastening the external conductor to the internal conductor. The fitting detection connector detects that a cover member closing the fastening opening is installed to the fastening opening and includes a receiving connector which is fixed inside the case and a detachable connector which is attached on the cover member. The wall surface extends in the gravity direction. The receiving connector has a receiving surface extending to a vicinity of an inner wall surface of the case and positioned below the fastening part in the gravity direction.

5 Claims, 3 Drawing Sheets

ELECTRICAL COMPONENT DEVICE

BACKGROUND

The present invention relates to an electrical component device, and particularly, relates to an electrical component device having a fastening structure in which a fastening member is inserted into a case, in which electrical components are accommodated, from an opening at a wall surface of the case to fasten two or more conductors inside the case.

In an electrical component device having the above structure, for example, as described in a patent document 1, when a busbar which is an internal conductor and a connecting terminal which is an external conductor are fastened by a bolt which is a fastening member, the bolt may be accidentally dropped into the case. In that case, for example, if the bolt is dropped onto the bottom of the case, there is a problem which is that it is not easy to take out the bolt. Thus, in the patent document 1, it is shown that a cylindrical drop prevention member is provided in a space, from the fastening opening, which is provided at a wall surface of the case in which the fastening member is inserted, to a fastening part where the internal conductor and the connecting terminal are fastened, so that the bolt will not be dropped onto the bottom of the case.

[Patent document 1] Japan Patent Publication No. 2011-187933

SUMMARY

It is one advantageous aspect of the present invention to provide an electric components device in which a fastening member is prevented from being dropped into the case when an external conductor is fastened to an internal conductor of the electrical component device by the fastening member by using a simple structure.

According to one aspect of the invention, there is provided an electrical component device comprising:
   an internal conductor, configured to be connected to an electrical component, and including a fastening part configured to be fastened with an external conductor;
   a case, configured to accommodate the electrical component and the internal conductor, and having a wall surface formed with a fastening opening for fastening the external conductor to the internal conductor from an outside of the case with a fastening member;
   a cover member closing the fastening opening; and
   a fitting detection connector, configured to detect that the cover member is installed to the fastening opening, and including a receiving connector which is fixed inside the case and a detachable connector which is attached on the cover member and opposes to the receiving connector so as to be detachable therefrom,
   wherein the wall surface formed with the fastening opening extends in the gravity direction, and
   wherein the receiving connector has a receiving surface extending to a vicinity of an inner wall surface of the case and positioned below the fastening part in the gravity direction.

The external conductor may be held to an external connector which is installed to an opening formed in an upper wall surface of the case.

The receiving surface may extend to the vicinity of the inner wall surface which is opposite to the wall surface formed with the fastening opening.

The internal conductor may be a busbar.

The fastening opening may be formed at a position of the wall surface opposing the fastening part in a direction perpendicular to the gravity direction.

BRIEF DESCRIPTION OF DRAWINGS

FIG. 2A is a sectional view at the same position as FIG. 1. FIG. 2B is a section view taken along the line IIb-IIb of FIG. 1.

FIG. 3A shows a state before a cover is attached. FIG. 3B shows a state that the cover is attached.

DETAILED DESCRIPTION OF EXEMPLIFIED EMBODIMENTS

Because the drop prevention member described in the patent document 1 is a component intended for exclusive use with drop prevention, it is necessary to separately provide a supporting unit to support the drop prevention member inside the case, and there is a problem which is that the components inside the case become more.

One of problems to be solved by the invention is to prevent a fastening member from being dropped into the case when an external conductor is fastened to an internal conductor of the electrical component device by the fastening member by using a simple structure.

Figure 1:
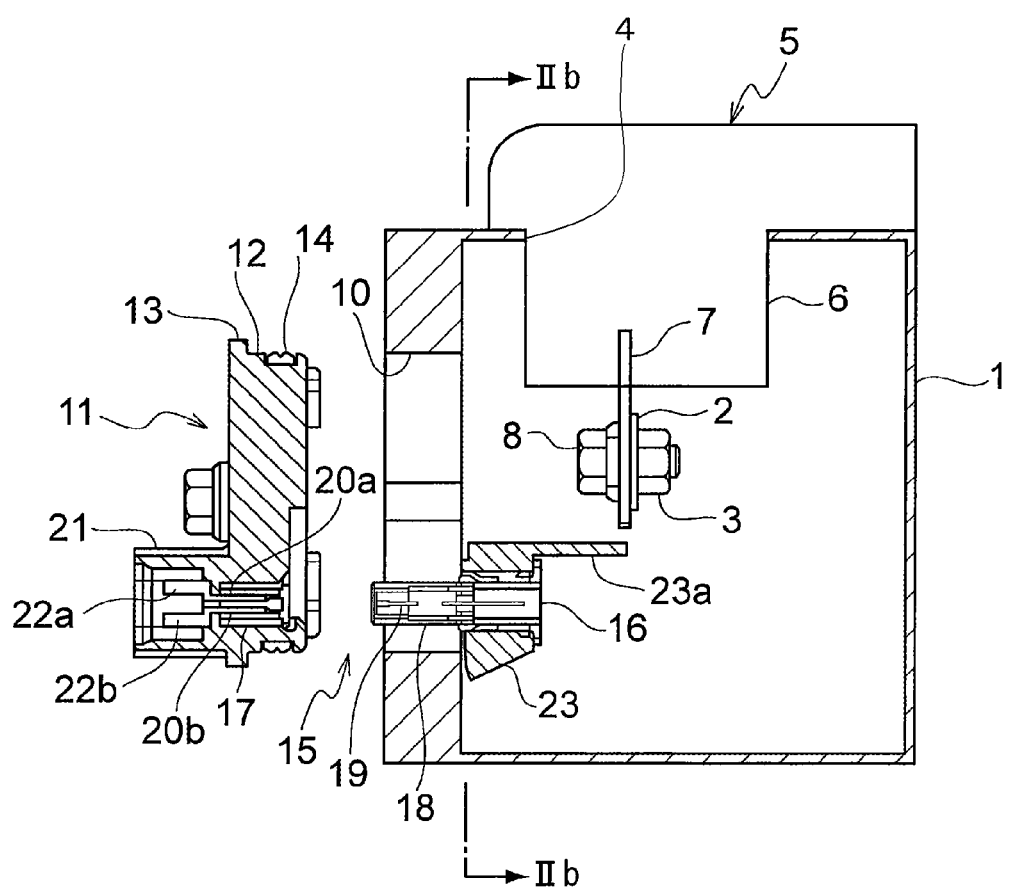
FIG. 1 shows a section of main parts of an electrical component device according to an embodiment of the present invention.

An electrical component device of the prevent invention will be described based on the embodiment shown in FIGS. 1 to 3B. FIG. 1 shows a section of main parts of an embodiment of the prevent invention which is applied to a power distributer. The present invention is not limited to the power distributer, but can be applied to an electrical component device which includes a case in which electrical components and internal conductors connected to the electrical components are accommodated, a fastening opening which is provided at a wall surface of the case and which is used when external conductors inserted from outside are fastened to the internal conductors by fastening members from outside the case, a cover member which closes the fastening opening, and a fitting detection connector which detects that the cover member is installed to the fastening opening.

The power distributer of the embodiment, as shown in FIGS. 1 to 3B, includes a case 1 made of resin or metal. The case 1 of the embodiment is formed into a rectangular box shape, but the shape of the case 1 is not limited to that of the embodiment. Power distribution circuit components which are electrical components (not shown) are accommodated in the case 1. In addition, a pair of busbars 2 which are internal conductors are connected to the power distribution circuit components (not shown). Each busbar 2 is formed with a through hole (not shown), and a nut 3 equivalent to a fastening member is fixed at the right side (in the figure) of the through hole. In addition, the upper wall of the case 1 is formed with an opening 4, and a terminal holding part 6 of an external connector 5 connected to a power source (not shown) is inserted to be installed into the opening 4.

A pair of connecting terminals 7 which are external conductors hang down from the bottom of the terminal holding part 6 of the external connector 5. The connecting terminals 7 are formed with through holes into which bolts 8, which are fastening members, are inserted. Thus, by screwing the bolt 8 into the nut 3, each busbar 2 and each connecting terminal 7 are fastened together and electrically connected.

A fastening opening 10, which is an opening used for an operation of fastening the busbars 2 and the connecting terminals 7 by screwing the bolts 8 which are inserted into the through holes of the busbars 2 and the connecting terminals 7 into the nuts 3, is formed at a position of the wall surface of the case 1, opposing the fastening part of the busbars 2 and the connecting terminals 7 in a direction perpendicular to the gravity direction. Because it is possible to carelessly contact the busbars 2 or the connecting terminals 7 and get an electric shock, or in order to waterproof, a cover member 11 made of insulating resin is installed to the fastening opening 10.

Figure 3A:
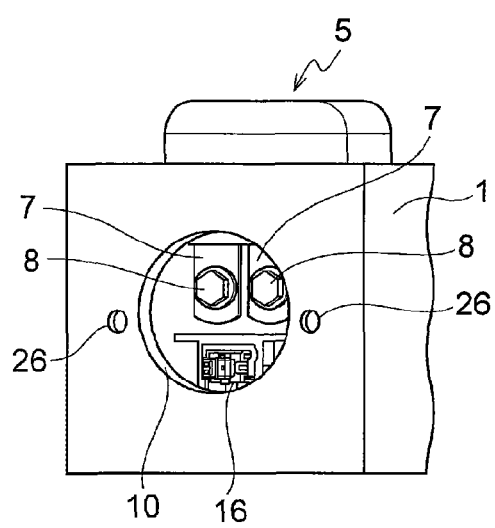
FIGS. 3A and 3B are appearance figures which describe a procedure of assembling the embodiment of FIG. 1.

The fastening opening 10, as shown in FIG. 3A, is formed to be a circular opening. Accordingly, the cover member 11 includes a cylindrical inserting part 12 and a diamond shaped flange 13 to which the inserting part 12 is adjacent. A waterproof ring packing 14 is installed into a groove which the outer peripheral surface of the inserting part 12 is formed with. The lower part of the cover member 11 in the figure is provide with a fitting detection connector 15 which detects that the cover member 11 is installed into the fastening opening 10.

Figure 2A:
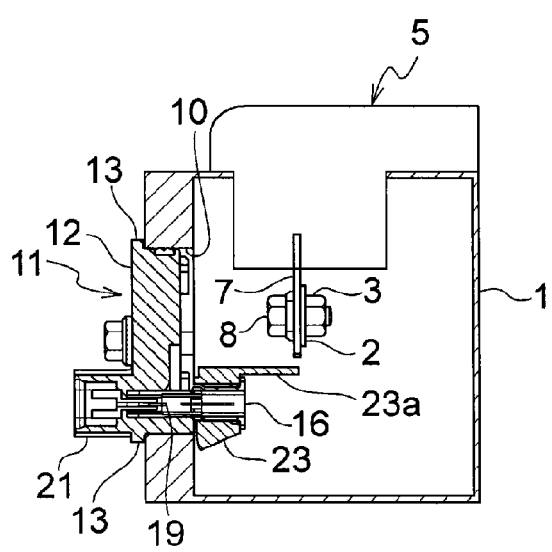
FIGS. 2A and 2B describe procedures of assembling the embodiment of FIG. 1.

The fitting detection connector 15 is formed of a pair of connectors which are fittable to each other, and includes a receiving connector 16 which is fixed inside the case 1 and an detachable connector 17 which the cover member 11 is provided with and which is detachable to/from the receiving connector 16. In the receiving connector 16, a fitting detection conductor 19 is accommodated in a cylindrical housing 18, and the distal end of the receiving connector 16 at the side where the detachable connector 17 is attached/detached is opened. The detachable connector 17 holds a pair of detective electrodes 20a and 20b and is formed integrally with the inserting part 12 of the cover member 11. One ends of the pair of the detective electrodes 20a and 20b are connected to external terminals 22a and 22b positioned in an accommodating part which a cylindrical part 21 of the detachable connector 17 is formed with. The external terminals 22a and 22b are formed to output a fitting detection signal through electric wires (not shown) which are inserted from a distal end opening of the cylindrical part 21. In other words, as shown in FIG. 2A, if the cover member 11 is installed into the fastening opening 10, the detachable connector 17 is fitted to the receiving connector 16. Therefore, the pair of detective electrodes 20a and 20b are conducted by the fitting detection conductor 19, and a conduction signal is drawn out as a fitting detection signal from the external terminals 22a and 22b.

Figure 2B:
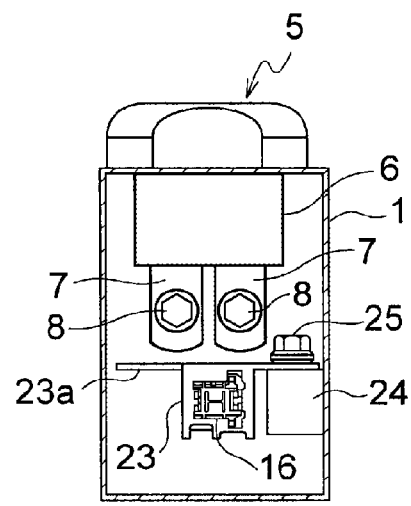

The base of the housing 18 in which the fitting detection conductor 19 of the receiving connector 16 is accommodated, as shown in FIG. 2B, is installed to a receiving connector holding member 23 which is formed into a square cylindrical shape. In particular, the top surface of the receiving connector holding member 23 in the figure is formed with a flat fastening member receiving surface part 23a by extending the edge part of the receiving connector holding member 23. The fastening member receiving surface part 23a is positioned below the fastening part of the busbars 2 and the connecting terminals 7 in the gravity direction, and extends and expands to the vicinity of the inner wall surface of the case 1. This inner wall surface is opposite to the wall surface formed with the fastening opening 10. In addition, the gap between the lower end of the fastening part in the gravity direction and the fastening member receiving surface part 23a is formed to be smaller than the bolts 8 which are the fastening members. The receiving connector 16 is supported by fixing the fastening member receiving surface part 23a to a supporting member 24, which is fixed to the side wall inside the case 1, with a bolt 25.

Figure 3B:
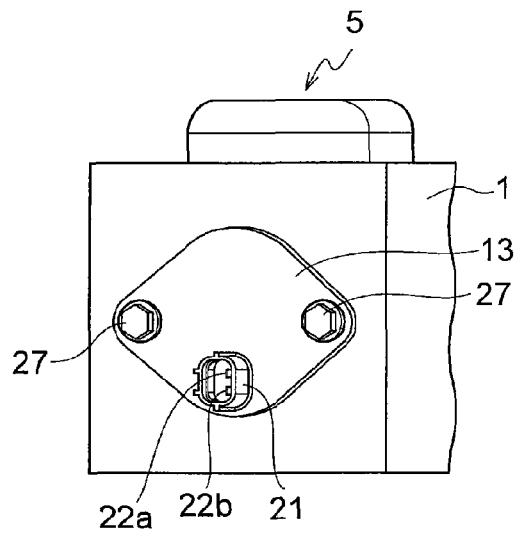

According to the embodiment constructed in this way, in FIGS. 1 to 3B, the receiving connector 16 is fixed to the supporting member 24, and while the connecting terminals 7 are aligned to the busbars 2, the external connector 5 is installed to the case 1. Then, the bolts 8 are inserted from the fastening opening 10 into the through holes of the connecting terminals 7 and the busbars 2, and the bolts 8 are fastened by being screwed into the nuts 3. Therefore, the connecting terminals 7 and the busbars 2 can be fastened together. At this time, even if the bolt 8 dropped accidentally, the bolt 8 can be prevented from dropping onto the bottom of the case 1 because the bolt 8 is received by the fastening member receiving surface part 23a of the receiving connector 16. After the connecting terminals 7 and the busbars 2 are fastened together, when the cover member 11 is installed to the fastening opening 10, the detachable connector 17 is fitted to the receiving connector 16. As shown in FIGS. 3A and 3B, when two bolts 27 are screwed into two bottomed screw holes 26 which an exterior wall of the case 1 is formed with, the cover member 11 having the flange 13 is fixed to the case 1. In addition, when the cover member 11 is installed into the fastening opening 10, a fitting detection signal is output from the external terminals 20a and 20b of the fitting detection connector 15 toward the power source side. Thereby, after safety is confirmed, power is allowed to be supplied to the power distributer of the embodiment.

As described above, according to the embodiment, because the receiving connector 16 of the fitting detection connector 15, which detects the cover member 11 is installed to the fastening opening 10, is positioned below the fastening part of the busbars 2 and the connecting terminals 7 in the gravity direction, and is formed with the fastening member receiving surface part 23a which expands to the vicinity of the inner wall surface of the case 1, when the connecting terminals 7 which are the external conductors are fastened to the busbars 2 which are the internal conductors of the electrical component device with the bolts 8 which are the fastening members, the situation that the bolt 8 is dropped into the case 1 can be prevented with a simple structure without separately providing a dropping prevention member.

The present invention was described based on an embodiment, but the prevent invention is not limited to the embodiment. Those skilled in the art know that it is possible to implement the invention in the scope of the spirit of the prevent invention with a modified or changed embodiment, and the modified or changed embodiment surely belong to the scope of claims of the present application.

What is claimed is:
1. An electrical component device comprising:
an internal conductor, configured to be connected to an electrical component, and including a fastening part configured to be fastened with an external conductor;
a case, configured to accommodate the electrical component and the internal conductor, and having a wall surface formed with a fastening opening for fastening the external conductor to the internal conductor from an outside of the case with a fastening member;
a cover member closing the fastening opening; and
a fitting detection connector, configured to detect that the cover member is installed to the fastening opening, and including a receiving connector which is fixed inside the case and a detachable connector which is attached on the cover member and opposes to the receiving connector so as to be detachable therefrom, wherein the wall surface formed with the fastening opening extends in the gravity direction, and wherein the receiving connector has a receiving surface extending to a vicinity of an inner wall surface of the case and positioned below the fastening part in the gravity direction.

2. The electrical component device according to claim 1, wherein the external conductor is held to an external connector which is installed to an opening formed in an upper wall surface of the case.

3. The electrical component device according to claim 1, wherein the receiving surface extends to the vicinity of the inner wall surface which is opposite to the wall surface formed with the fastening opening.

4. The electrical component device according to claim 1, wherein the internal conductor is a busbar.

5. The electrical component device according to claim 1, wherein the fastening opening is formed at a position of the wall surface opposing the fastening part in a direction perpendicular to the gravity direction.

* * * * *